(12) United States Patent
Li

(10) Patent No.: US 11,327,618 B2
(45) Date of Patent: May 10, 2022

(54) TOUCH SUBSTRATE AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Yuanhang Li, Wuhan (CN)

( * ) Notice: Subject to any disclaimer, the term of this patent is extended or adjusted under 35 U.S.C. 154(b) by 293 days.

(21) Appl. No.: 16/630,438

(22) PCT Filed: Oct. 21, 2019

(86) PCT No.: PCT/CN2019/112253
§ 371 (c)(1),
(2) Date: Jan. 12, 2020

(87) PCT Pub. No.: WO2021/007977
PCT Pub. Date: Jan. 21, 2021

(65) Prior Publication Data
US 2021/0365154 A1 Nov. 25, 2021

(30) Foreign Application Priority Data
Jul. 18, 2019 (CN) .......................... 201910650963.9

(51) Int. Cl.
G06F 3/044 (2006.01)
G06F 3/041 (2006.01)
H01L 27/32 (2006.01)

(52) U.S. Cl.
CPC ........ *G06F 3/0446* (2019.05); *G06F 3/04164* (2019.05); *G06F 2203/04111* (2013.01); *G06F 2203/04112* (2013.01); *H01L 27/323* (2013.01)

(58) Field of Classification Search
CPC combination set(s) only.
See application file for complete search history.

(56) References Cited

U.S. PATENT DOCUMENTS

| 2017/0336907 | A1 | 11/2017 | Jeong et al. |
| 2017/0336909 | A1* | 11/2017 | Song ............... G06K 9/0002 |
| 2018/0032193 | A1* | 2/2018 | Qu ............... G06F 3/04164 |
| 2019/0265820 | A1 | 8/2019 | Li |
| 2019/0377442 | A1 | 12/2019 | Feng |

FOREIGN PATENT DOCUMENTS

| CN | 108319398 A | 7/2018 |
| CN | 108829285 A | 11/2018 |

* cited by examiner

*Primary Examiner* — Deeprose Subedi

(57) ABSTRACT

A touch substrate and a display panel are disclosed. The touch substrate includes a touch region and a binding region, and the touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region.

15 Claims, 6 Drawing Sheets

TOUCH SUBSTRATE AND DISPLAY PANEL

FIELD OF INVENTION

The present disclosure relates to field of display technology, and particularly relates to a touch substrate and a display panel.

BACKGROUND OF INVENTION

With rapid development of electronic products, organic light emitting diodes (OLEDs) have advantages of simple structure, quick response speed, active illumination, and low power consumption, which have wide applications in fields of mobile phones, tablets, and televisions.

In prior art, add on structures similar to liquid crystal displays (LCDs) have been appeared, that is, integrating touch panels and OLEDs together. This type of the OLEDs are thinner and lighter than normal add on structures, and have advantages such as simple production processes and higher transmission rate, becoming a main future development trend of OLEDs.

In prior art, black frames exist on both sides of touch regions of display panels, reducing an area proportion of the touch regions of the display panels.

SUMMARY OF INVENTION

The present disclosure provides a touch substrate and a display panel, which can increase an area proportion of touch regions of the display panel.

In order to solve the problems mentioned above, the present disclosure provides a touch substrate. The touch substrate includes a touch region and a binding region. The touch region and the binding region are arranged along a first direction.

The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region.

The touch substrate further includes a plurality of second touch electrodes and a plurality of second lead wires. The plurality of the second touch electrodes are located on the touch region. The plurality of the second lead wires are sequentially arranged along a second direction, and the second direction is perpendicular to the first direction. The second lead wires are located on the binding region. One end of each of the plurality of the second lead wires is connected to the plurality of the second touch electrodes one by one, and another end of each of the plurality of the second lead wires is connected to the binding region.

The touch substrate includes a first connection pin and a second connection pin. The first connection pin and the second connection pin are spaced apart from each other on the binding region. The plurality of the first lead wires include third lead wires and fourth lead wires. The third lead wires are respectively connected to the first connection pin. The fourth lead wires are respectively connected to the second connection pin.

Further, the touch substrate includes an insulation layer and a planarization layer which are disposed adjacently. The first touch electrodes, the second touch electrodes, and the second lead wires are located in the planarization layer. The plurality of the first lead wires are located in the insulation layer. A first via is disposed between the insulation layer and the planarization layer. The end of each of the plurality of the first lead wires is connected to one of the plurality of the first touch electrodes through the first via.

In order to solve the problems mentioned above, on the second aspect, the present disclosure provides a touch substrate. The touch substrate includes a touch region and a binding region. The touch region and the binding region are arranged along a first direction.

The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region.

The touch substrate further includes a plurality of second touch electrodes and a plurality of second lead wires. The plurality of the second touch electrodes are located on the touch region. The plurality of the second lead wires are sequentially arranged along a second direction, and the second direction is perpendicular to the first direction. The second lead wires are located on the binding region. One end of each of the plurality of the second lead wires is connected to the plurality of the second touch electrodes one by one, and another end of each of the plurality of the second lead wires is connected to the binding region.

Further, the touch substrate includes an insulation layer and a planarization layer which are disposed adjacently. The first touch electrodes, the second touch electrodes, and the second lead wires are located in the planarization layer. The plurality of the first lead wires are located in the insulation layer. A first via is disposed between the insulation layer and the planarization layer. The end of each of the plurality of the first lead wires is connected to one of the plurality of the first touch electrodes through the first via.

Further, the first touch electrodes include a plurality of touch sub-electrodes connected in sequence. Bridge points are disposed on intersection positions of the first touch electrodes and the second touch electrodes, and the bridge points are located on the insulation layer; second vias are disposed between the insulation layer and the planarization layer; adjacent two of the touch sub-electrodes are respectively connected to the bridge points through the second vias to make the adjacent two touch sub-electrodes form bridge connections.

Further, a projection region of the bridge points on the planarization layer and a projection region of the first lead wires located in the touch region on the planarization layer are spaced apart from each other.

Further, the first lead wires located in the touch region are first metal mesh wires; the first touch electrodes, the second touch electrodes are second metal mesh wires. A projection of the first metal mesh wires on the touch substrate overlaps a projection of the second metal mesh wires on the touch substrate.

Further, a via, a groove, or a fracture is disposed on the first metal mesh wires, the first metal mesh wires include a plurality of mesh units; a width of the first metal mesh wires along the second direction is at least as a width of the two mesh units, and at most as a width of the four mesh units.

Further, the first touch electrodes are receiving touch electrodes or emission touch electrodes. The second touch electrodes are receiving touch electrodes or emission touch electrodes, and the first touch electrodes are different from the second touch electrodes.

Further, the touch substrate includes a first connection pin and a second connection pin. The first connection pin and the second connection pin are spaced apart from each other on the binding region. The plurality of the first lead wires include third lead wires and fourth lead wires. The third lead wires are respectively connected to the first connection pin. The fourth lead wires are respectively connected to the second connection pin.

In order to solve the problems mentioned above, on the third aspect, the present disclosure provides a touch substrate. The touch substrate includes a touch region and a binding region. The touch region and the binding region are arranged along a first direction.

The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region.

The touch substrate further includes a plurality of second touch electrodes and a plurality of second lead wires. The plurality of the second touch electrodes are located on the touch region. The plurality of the second lead wires are sequentially arranged along a second direction, and the second direction is perpendicular to the first direction. The second lead wires are located on the binding region. One end of each of the plurality of the second lead wires is connected to the plurality of the second touch electrodes one by one, and another end of each of the plurality of the second lead wires is connected to the binding region.

Further, the touch substrate includes an insulation layer and a planarization layer which are disposed adjacently. The first touch electrodes, the second touch electrodes, and the second lead wires are located in the planarization layer. The plurality of the first lead wires are located in the insulation layer. A first via is disposed between the insulation layer and the planarization layer. The end of each of the plurality of the first lead wires is connected to one of the plurality of the first touch electrodes through the first via.

Further, the first touch electrodes include a plurality of touch sub-electrodes connected in sequence. Bridge points are disposed on intersection positions of the first touch electrodes and the second touch electrodes, and the bridge points are located on the insulation layer; second vias are disposed between the insulation layer and the planarization layer; adjacent two of the touch sub-electrodes are respectively connected to the bridge points through the second vias to make the adjacent two touch sub-electrodes form bridge connections.

Further, a projection region of the bridge points on the planarization layer and a projection region of the first lead wires located in the touch region on the planarization layer are spaced apart from each other.

Further, the first lead wires located in the touch region are first metal mesh wires; the first touch electrodes, the second touch electrodes are second metal mesh wires, wherein a projection of the first metal mesh wires on the touch substrate overlaps a projection of the second metal mesh wires on the touch substrate.

Further, a via, a groove, or a fracture is disposed on the first metal mesh wires, the first metal mesh wires include a plurality of mesh units; a width of the first metal mesh wires along the second direction is at least as a width of the two mesh units, and at most as a width of the four mesh units.

Further, the first touch electrodes are receiving touch electrodes or emission touch electrodes. The second touch electrodes are receiving touch electrodes or emission touch electrodes, and the first touch electrodes are different from the second touch electrodes.

Further, the touch substrate includes a first connection pin and a second connection pin. The first connection pin and the second connection pin are spaced apart from each other on the binding region. The plurality of the first lead wires include third lead wires and fourth lead wires. The third lead wires are respectively connected to the first connection pin. The fourth lead wires are respectively connected to the second connection pin.

Beneficial Effects: different from prior art, the present disclosure provides a touch substrate, and the touch substrate includes a touch region and a binding region. The touch region and the binding region are arranged along a first direction. The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region.

In the present disclosure, making at least one of the first lead wires be disposed in the touch region fully utilizes the touch region, and reduces an area of a non-touch region of the display panel, thereby improving an area proportion of the touch region of the display panel, realizing narrow bezels of the display panel, and moreover, without bezels.

DETAILED DESCRIPTION OF PREFERRED EMBODIMENTS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
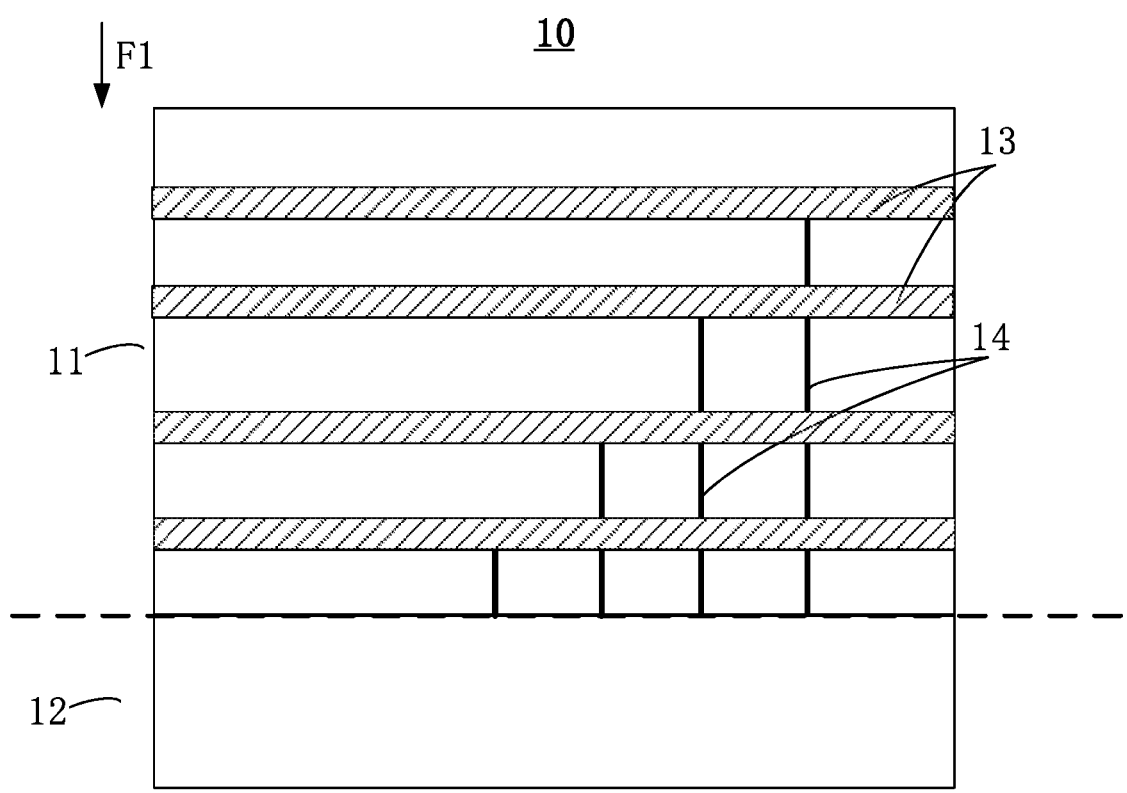
FIG. 1 is a schematic diagram of a planar structure of an embodiment of a touch substrate provided by embodiments of the present disclosure.

The technical solutions in the embodiments of the present disclosure are clearly and completely described in the following with reference to the accompanying drawings in the embodiments of the present disclosure. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", etc is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the present disclosure, the term "exemplary" is used to mean "serving as an example, instance, or illustration." Any embodiment described in this application as "exemplary" is not necessarily to be interpreted as preferred or advantageous over other embodiments. The following description is presented for enable any person skilled in the art to make and use the present disclosure. In the following description, details are listed for the purpose of explanation. It should be understood that one skilled in the art will recognize that the present disclosure can be practiced without the specific details. In other embodiments, well-known structures and procedures are not described in detail to avoid unnecessary details making the description of the present disclosure to become opacity. Therefore, the present disclosure is not intended to be limited to the embodiments shown, but is in accordance with the broad scope of the principles and characteristics disclosed by present disclosure.

The present disclosure provides a touch substrate, and the touch substrate includes a touch region and a binding region. The touch region and the binding region are arranged along a first direction. The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region. The touch substrate of embodiments of the present disclosure can be applied in various display panels. The details are described below.

Please refer to FIG. 1, FIG. 1 is a schematic diagram of a planar structure of an embodiment of a touch substrate provided by embodiments of the present disclosure.

In this embodiment, the touch substrate 10 includes a touch region 11 and a binding region 12. The touch region 11 and the binding region 12 are arranged along a first direction F1.

The touch substrate 10 includes a plurality of first touch electrodes 13 and a plurality of first lead wires 14. The plurality of the first touch electrodes 13 are located on the touch region 11.

The plurality of the first touch electrodes 13 are sequentially arranged along the first direction F1. One end of each of the plurality of the first lead wires 14 is connected to the plurality of the first touch electrodes 13 one by one, and another end of each of the plurality of the first lead wires 14 is connected to the binding region 12. Further, at least one of the first lead wires 14 is located in the touch region 11. In the present disclosure, making at least one of the first lead wires 14 be disposed in the touch region 11 fully utilizes the touch region 11, and reduces an area of a non-touch region of the display panel, thereby improving an area proportion of the touch region 11 of the display panel, realizing narrow bezels of the display panel, and moreover, without bezels.

Figure 2:
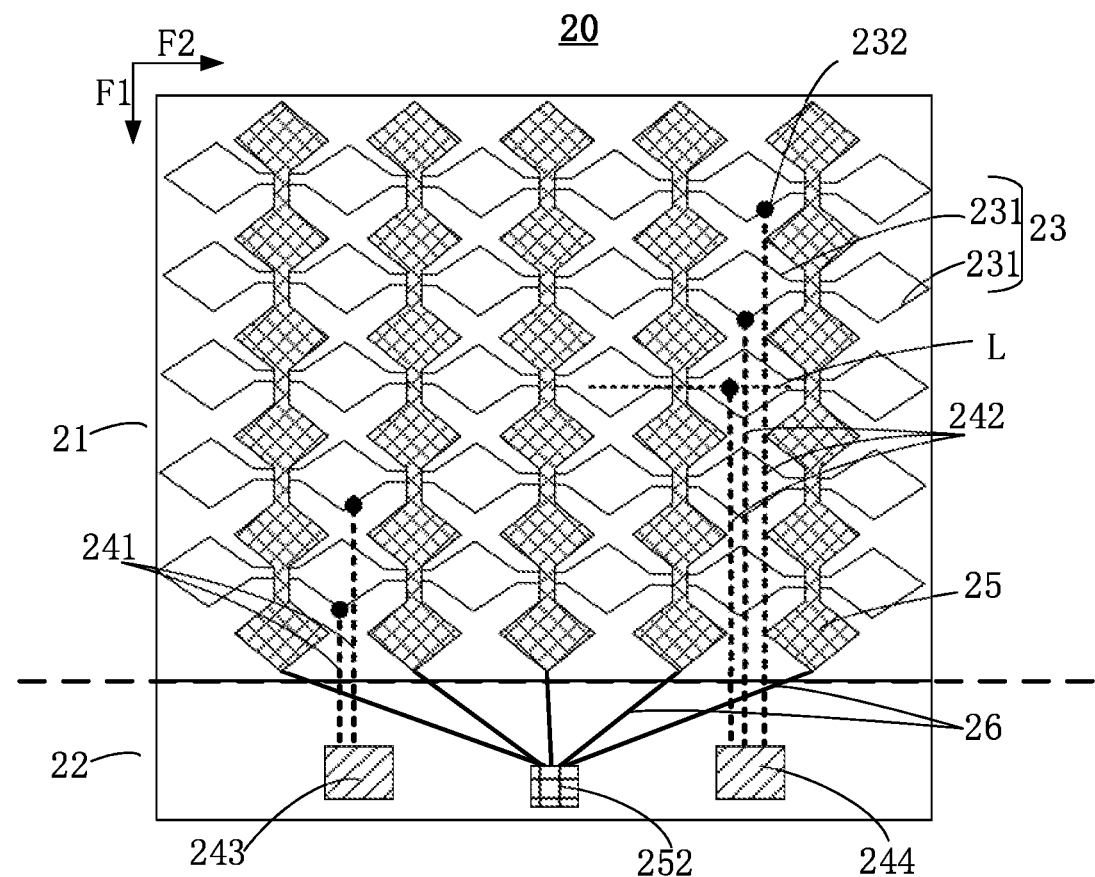
FIG. 2 is a schematic diagram of a planar structure of another embodiment of a touch substrate provided by embodiments of the present disclosure.
Figure 3:
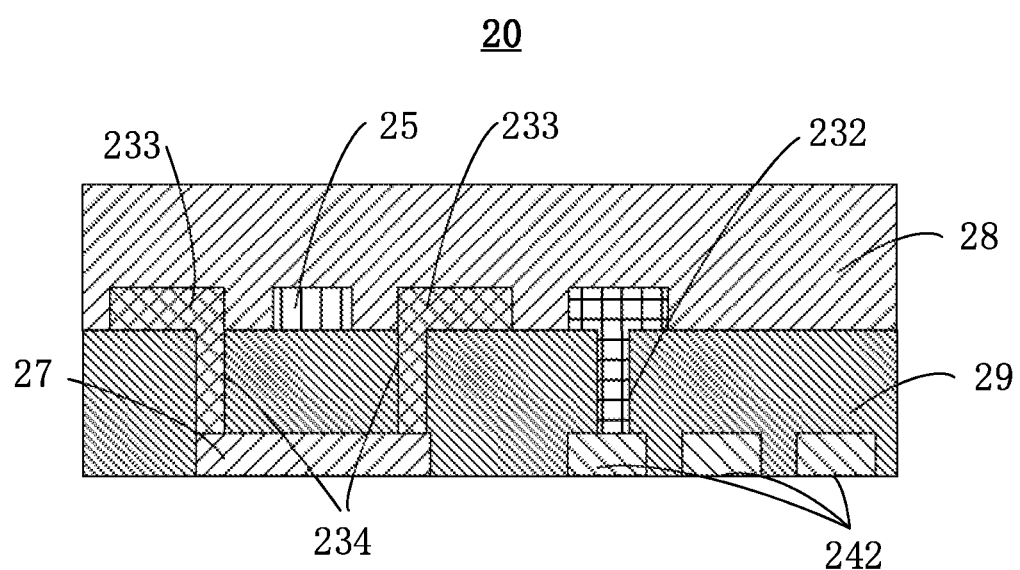
FIG. 3 is a schematic diagram of a section structure of the touch substrate along a section line L in FIG. 2.
Figure 4:
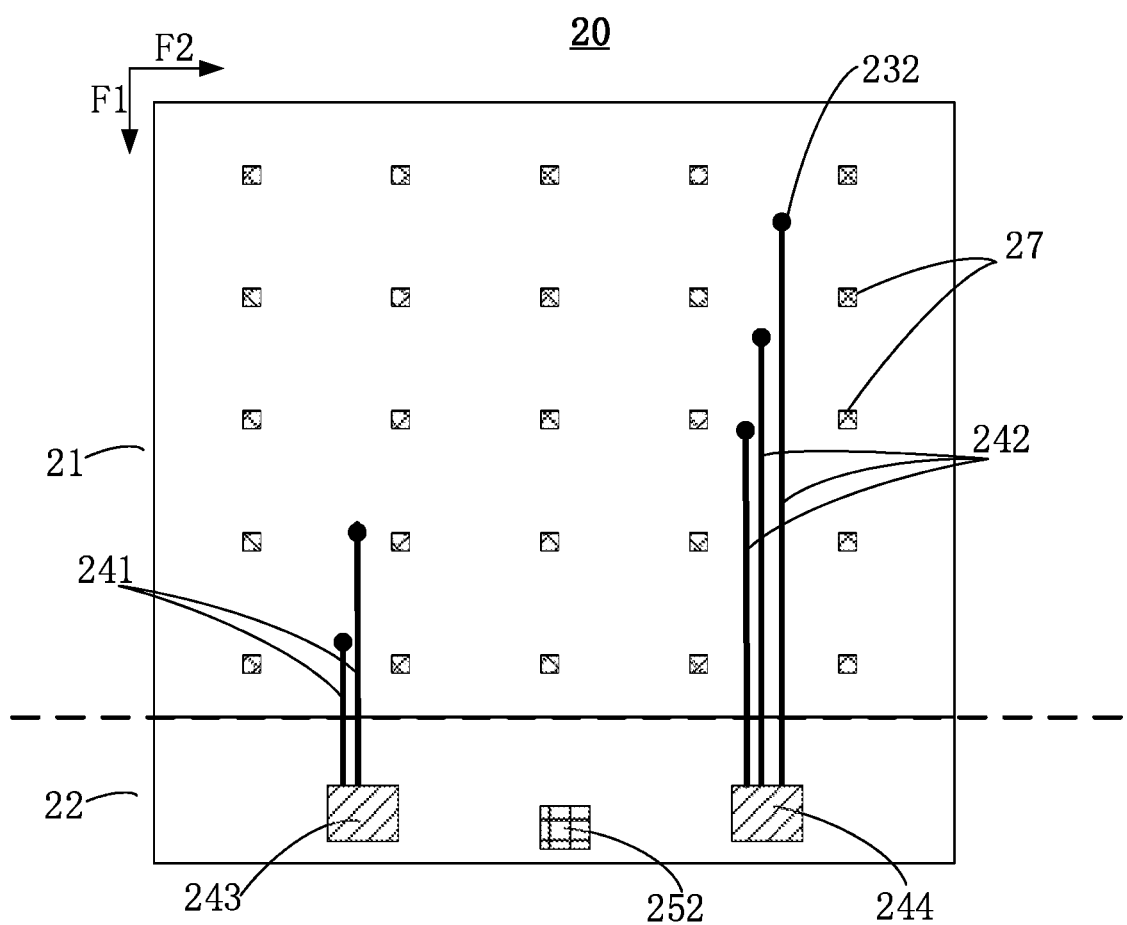
FIG. 4 is a schematic diagram of a planar structure of internals of an insulation layer of the touch substrate in FIG. 2.
Figure 5:
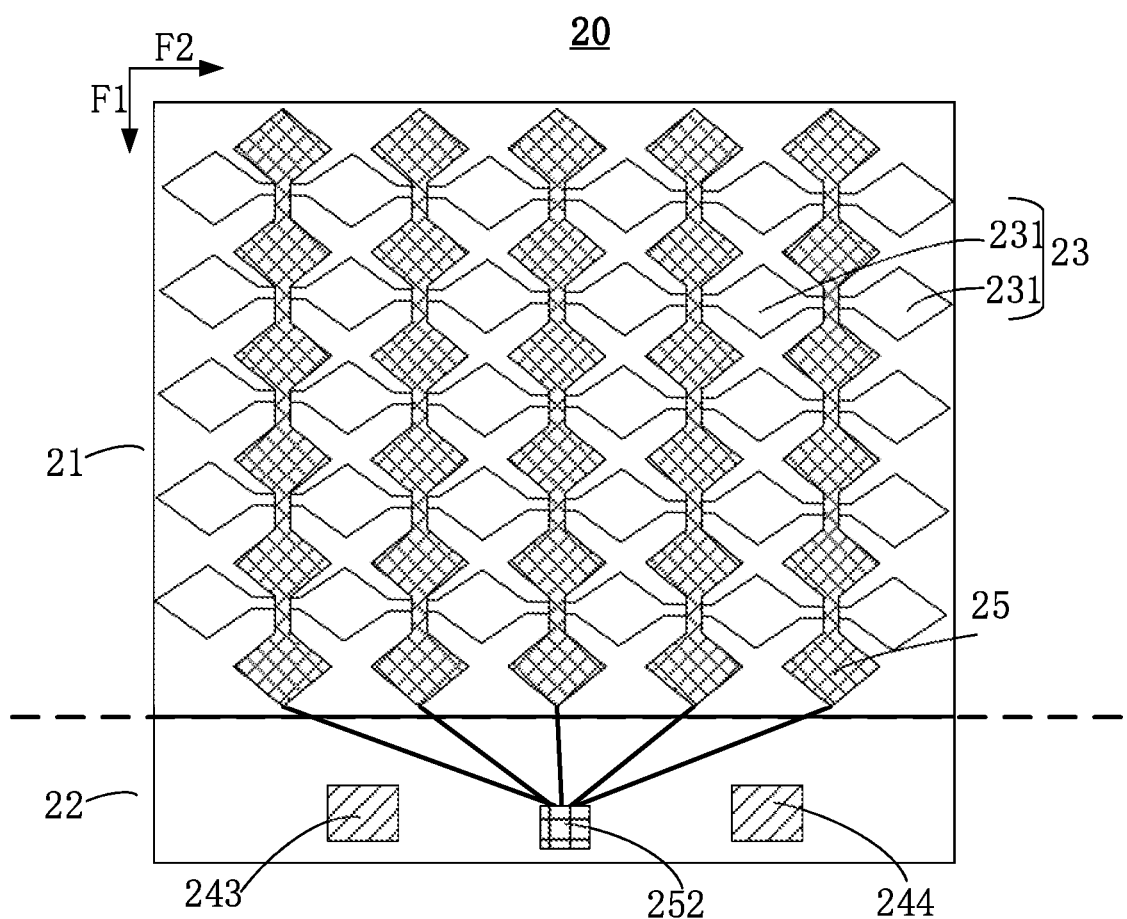
FIG. 5 is a schematic diagram of a planar structure of internals of a planarization layer of the touch substrate in FIG. 2.

In order to specifically describe the structures of the touch substrate of the present disclosure, please refer to FIG. 2 to FIG. 5. FIG. 2 is a schematic diagram of a planar structure of another embodiment of a touch substrate provided by embodiments of the present disclosure. FIG. 3 is a schematic diagram of a section structure of the touch substrate along a section line L in FIG. 2. FIG. 4 is a schematic diagram of a planar structure of internals of an insulation layer of the touch substrate in FIG. 2. FIG. 5 is a schematic diagram of a planar structure of internals of a planarization layer of the touch substrate in FIG. 2.

In this embodiment, the touch substrate 20 includes a touch region 21 and a binding region 22. The touch region 21 and the binding region 22 are arranged along a first direction F1. The touch substrate 20 includes a plurality of first touch electrodes 23 and a plurality of first lead wires. The plurality of the first lead wires include third lead wires 241 and fourth lead wires 242. The plurality of the first touch electrodes 23 are located on the touch region 21. The plurality of the first touch electrodes 23 are sequentially arranged along the first direction F1. One end of each of the plurality of the first lead wires is connected to the plurality of the first touch electrodes 23 one by one, and another end of each of the plurality of the first lead wires is connected to the binding region 22. Further, at least one of the first lead wires is located in the touch region 21. In other embodiments, at least one of the first lead wires is located in the touch region 21, and it is not limited by the present disclosure. In the present disclosure, making at least one of the first lead wires be disposed in the touch region 21 fully utilizes the touch region 21, and reduces an area of a non-touch region of the display panel, thereby improving an area proportion of the touch region 21 of the display panel, realizing narrow bezels of the display panel, and moreover, without bezels.

In this embodiment, the touch substrate 20 further includes a plurality of second touch electrodes 25 and a plurality of second lead wires 26. The plurality of the second touch electrodes 25 are located on the touch region 21. The plurality of the second lead wires 26 are sequentially arranged along a second direction F2, and the second direction F2 is perpendicular to the first direction F1. The second lead wires 22 are located on the binding region 22. One end of each of the plurality of the second lead wires 26 is connected to the plurality of the second touch electrodes 25 one by one, and another end of the plurality of the second lead wires 26 is connected to the binding region 22. In other embodiments, the second direction F2 may not be perpendicular to the first direction F1, and it is not limited by the present disclosure. The second lead wires 26 are located on the binding region 22, which also does not occupy the area on both sides of the touch region 21, thereby further realizing narrow bezels of the display panel, and moreover, without bezels.

In a preferred embodiment, the touch substrate 20 includes a first connection pin 243 and a second connection pin 244. The first connection pin 243 and the second connection pin 244 are spaced apart from each other on the binding region 22. The plurality of the first lead wires include third lead wires 241 and fourth lead wires 242. The third lead wires 241 are respectively connected to the first connection pin 243. The fourth lead wires 242 are respectively connected to the second connection pin 244. For example, a number of the first lead wires is five, a number of the third lead wires 241 is two, and a number of the fourth lead wires 242 is three. By the two connection pins spaced apart each other, and making the plurality of the lead wires divide into two portions to distribute on the touch region 21, can prevent all the first lead wires from centralized connecting to one connection pin to cause optical effect of the touch region 21 to decrease. In other embodiments, a number of the connection pins of the first lead wires is configured according to a specific situation, and it is not limited by the present disclosure.

Further, the touch substrate 20 further includes a third connection pin 252. The third connection pin 252 is located on the binding region 22. The third connection pin 252, the first connection pin 243, and the second connection pin 244 are spaced apart each other. Preferably, the first connection pin 243, the second connection pin 244, and the third connection pin 252 are sequentially arranged along the second direction F2. Connecting the lead wires by the three connection pins can make the lead wires discretely distribute on the binding region 22, thereby reducing an area of the binding region 22, improving an area proportion of the touch region 21 of the display panel, realizing narrow bezels of the display panel, and moreover, without bezels.

Further, an included angle between the second lead wires 26 and the second direction F2 is less than 40 degrees, which can further reduces an area of the binding region 22, thereby improving an area proportion of the touch region 21 of the display panel In other embodiments, the included angle between the second lead wires 26 and the second direction F2 is configured according to a specific situation, and it is not limited by the present disclosure.

In other embodiments, the first touch electrodes 23 are receiving touch electrodes or emission touch electrodes. The second touch electrodes 25 are receiving touch electrodes or emission touch electrodes, and the first touch electrodes 23 are different from the second touch electrodes 25. For example, the first touch electrodes 23 are receiving touch electrodes, and the second touch electrodes 25 are emission touch electrodes.

In this embodiment, the touch substrate 20 includes an insulation layer 29 and a planarization layer 28 which are disposed adjacently. Further, the planarization layer 28 is transparent insulation material, such as silicon nitride, silica, organic photoresist, or combination thereof. Preferably, a thickness of the planarization layer 28 is 2 micrometers. The insulation layer 29 is transparent insulation material, such as silicon nitride, silica, organic photoresist, or combination thereof. In other embodiments, material and the thickness of the insulation layer 29 and the planarization layer 28 are selected according to a specific situation, and it is not limited by the present disclosure. The insulation layer 29 and the planarization layer 28 insulate from each other, which ensures devices in them will not affect to each other, thereby ensuring the touch substrate 20 to work normally.

In this embodiment, the first touch electrodes 23, the second touch electrodes 25, and the second lead wires 26 are located in the planarization layer 28. The plurality of the first touch electrodes are located in the insulation layer 29. A first via 232 is disposed between the insulation layer 29 and the planarization layer 28. The end of each of the plurality of the first lead wires is connected to one of the plurality of the first touch electrodes 23 through the first via. The first lead wires 23, the second touch electrodes 25, and the second lead wires 26 are disposed on different layer to the plurality of the first lead wires, thereby preventing from mutual interference.

In this embodiment, the first touch electrodes 23 include a plurality of touch sub-electrodes 231. Bridge points 27 are disposed on intersection positions of the first touch electrodes 23 and the second touch electrodes 25. The bridge points 27 are located on the insulation layer 29. Second vias 234 are disposed between the insulation layer 29 and the planarization layer 28. Adjacent two of the touch sub-electrodes 231 are respectively connected to the bridge points 27 through the second vias 234 to make the adjacent two touch sub-electrodes 231 form bridge connections. The adjacent two touch sub-electrodes 231 are respectively connected to two bridge point capacitor regions 233. The two bridge point capacitor regions 233 connect to the bridge points 27 through the second vias 234 to make the adjacent two touch sub-electrodes 231 form bridge connections.

In this embodiment, a projection region of the bridge points 27 on the planarization layer 28 and a projection region of the first lead wires located in the touch region 21 on the planarization layer are spaced apart from each other. That is, the first lead wires 27 are run and are steered clear of the bridge points 27, which can prevent too many lead wires on the bridge points and causes mutual interference.

Figure 6:
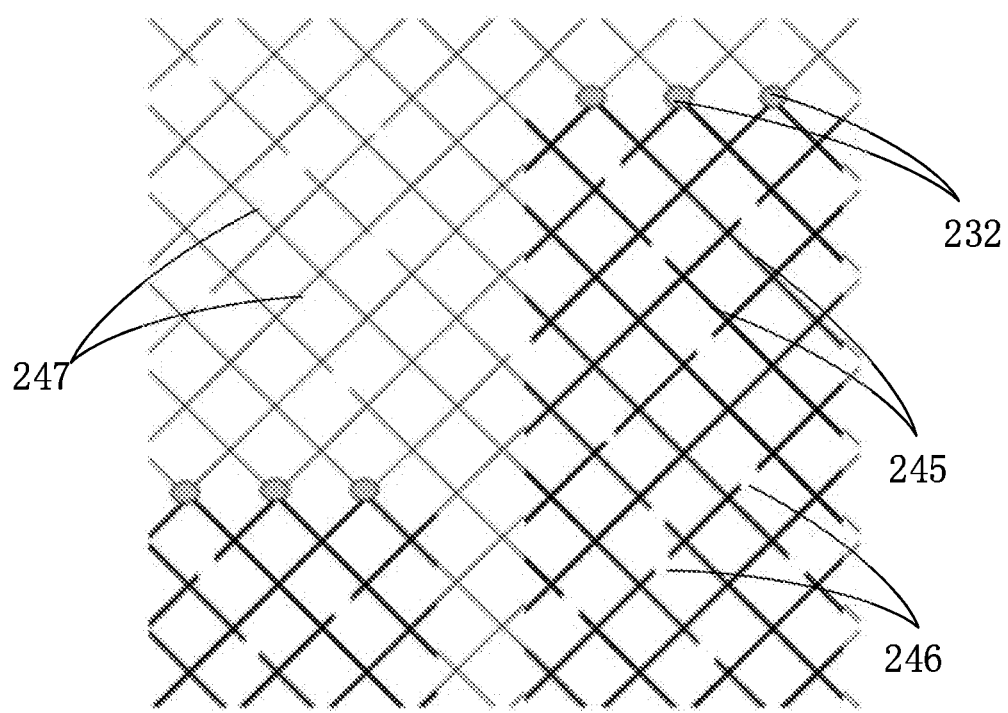
FIG. 6 is a schematic diagram of first metal mesh wires and second metal mesh wires in the touch substrate in FIG. 2.

Further, please refer to FIG. 6, FIG. 6 is a schematic diagram of first metal mesh wires and second metal mesh wires in the touch substrate in FIG. 2.

In this embodiment, the first lead wires located in the touch region 21 are first metal mesh wires 245, and the first touch electrodes 23, the second touch electrodes 25 are second metal mesh wires 247. Further, a projection of the first metal mesh wires 245 on the touch substrate 20 overlaps a projection of the second metal mesh wires 247 on the touch substrate 20. By adopting metal mesh wires, a light transmittance rate can be improved, thereby preventing the lead wires in the touch region 21 affecting optical effect of the touch region 21. In addition, a projection of the first metal mesh wires 245 on the touch substrate 20 overlaps a projection of the second metal mesh wires 247 on the touch substrate 20, which can further increase the light transmittance rate.

In this embodiment, a fracture 246 is disposed on the first metal mesh wires 245.

The first metal mesh wires 245 includes a plurality of mesh units. A width of the first metal mesh wires 245 along the second direction F2 is at a width of the four mesh units. In other embodiments, a via or a groove can be disposed on the first metal mesh wires 245. A width of the first metal mesh wires 245 along the second direction F2 is at least as a width of the two mesh units, and at most as a width of the four mesh units. A via, a groove, or a fracture can also be disposed on the second metal mesh wires 247, and it is not limited by the present disclosure. A via, a groove, or a fracture is disposed on the first metal mesh wires 245, which can further improve a light transmittance rate of the first metal mesh wires 245, thereby preventing the first lead wires affecting optical effect of the touch region 21.

In this embodiment, the first metal mesh wires 245 and the second metal mesh wires 247 are stacked metal wires. The stacked metal wire includes a first metal layer, a second metal layer, and a third metal layer which are disposed sequentially. Materials of the first metal layer, the second metal layer, and the third metal layer are respectively titanium, aluminum, and titanium, or materials of the first metal layer, the second metal layer, and the third metal layer are respectively molybdenum, aluminum, and molybdenum are selected according to a specific situation, and it is not limited by the present disclosure. In other embodiments, materials and structures of the first metal mesh wires 245 and the second metal mesh wires 247 are selected according to a specific situation, and it is not limited by the present disclosure.

Different from prior art, the present disclosure provides a touch substrate, and the touch substrate includes a touch region and a binding region. The touch region and the binding region are arranged along a first direction. The touch substrate includes a plurality of first touch electrodes and a plurality of first lead wires. The plurality of the first touch electrodes are located on the touch region. The plurality of the first touch electrodes are sequentially arranged along the first direction. One end of each of the plurality of the first lead wires is connected to one of the plurality of the first touch electrodes one by one, and another end of each of the plurality of the first lead wires is connected to the binding region. Further, at least one of the plurality of the first lead wires is located in the touch region. In the present disclosure, making at least one of the first lead wires be disposed in the touch region fully utilizes the touch region, and reduces an area of a non-touch region of the display panel, thereby improving an area proportion of the touch region of the display panel, realizing narrow bezels of the display panel, and moreover, without bezels.

It should be noted that, the structures are only described in the embodiments of the display panels mentioned above. It can be understood that, in addition to the structures mentioned above, the display device of the embodiments of the present disclosure may further include any other necessary structures as needed, and specifically, is not limited herein.

During a specific implementation, the various units or structures mentioned above may be implemented as a separate entity, or may be implemented in any combination, as the same or several entities. For the specific implementation of the various units or structures mentioned above, can refer to the method embodiments mentioned above, and will not give unnecessary details herein.

The touch substrate and the display panel provided by embodiments of the present disclosure are described in detail above. This article uses specific cases for describing the principles and the embodiments of the present disclosure, and the description of the embodiments mentioned above is only for helping to understand the method and the core idea of the present disclosure. Meanwhile, for those skilled in the art, will have various changes in specific embodiments and application scopes according to the idea of the present disclosure. In summary, the content of the specification should not be understood as limit to the present disclosure.

What is claimed is:

1. A touch substrate, comprising a touch region and a binding region;

the touch region and the binding region arranged along a first direction;

wherein the touch substrate comprises a plurality of first touch electrodes, a plurality of first lead wires, a plurality of second touch electrodes, a plurality of second lead wires, a first connection pin, a second connection pin, an insulation layer, and a planarization layer;

wherein the plurality of the first touch electrodes are located on the touch region; the plurality of the first touch electrodes are sequentially arranged along the first direction; one end of each of the plurality of the first lead wires is connected to one of the plurality of the first touch electrodes one by one, and another end of each of the plurality of the first lead wires is connected to the binding region; wherein at least one of the plurality of the first lead wires is located in the touch region;

wherein the plurality of the second touch electrodes are located on the touch region; the plurality of the second lead wires sequentially are arranged along a second direction, the second direction is perpendicular to the first direction; the second lead wires are located on the binding region; one end of each of the plurality of the second lead wires is connected to the plurality of the second touch electrodes one by one, and another end of each of the plurality of the second lead wires is connected to the binding region;

wherein the first connection pin and the second connection pin are spaced apart from each other on the binding region; the plurality of the first lead wires comprise third lead wires and fourth lead wires; the third lead wires are respectively connected to the first connection pin; the fourth lead wires are respectively connected to the second connection pin; and wherein the insulation layer and the planarization layer are disposed adjacently; the first touch electrodes, the second touch electrodes, and the second lead wires are located in the planarization layer; the plurality of the first lead wires are located in the insulation layer; a first via is disposed between the insulation layer and the planarization layer; and the end of each of the plurality of the first lead wires is connected to one of the plurality of the first touch electrodes through the first via.

2. A touch substrate, comprising a touch region and a binding region; the touch region and the binding region arranged along a first direction;

wherein the touch substrate comprises a plurality of first touch electrodes, a plurality of first lead wires, a plurality of second touch electrodes, and a plurality of second lead wires;

wherein the plurality of the first touch electrodes are located on the touch region; the plurality of the first touch electrodes are sequentially arranged along the first direction; one end of each of the plurality of the first lead wires is connected to the plurality of the first touch electrodes one by one, and another end of each of the plurality of the first lead wires is connected to the binding region; wherein at least one of the plurality of the first lead wires is located in the touch region;

wherein the plurality of the second touch electrodes are located on the touch region; the plurality of the second lead wires sequentially are arranged along a second direction, the second direction is perpendicular to the first direction; the second lead wires are located on the binding region; one end of each of the plurality of the second lead wires is connected to the plurality of the second touch electrodes one by one, and another end of each of the plurality of the second lead wires is connected to the binding region; and wherein the first lead wires located in the touch region are first metal mesh wires; the first touch electrodes, the second touch electrodes are second metal mesh wires, wherein a projection of the first metal mesh wires on the touch substrate overlaps a projection of the second metal mesh wires on the touch substrate.

3. The touch substrate as claimed in claim 2, wherein the touch substrate comprises an insulation layer and a planarization layer which are disposed adjacently; the first touch electrodes, the second touch electrodes, and the second lead wires are located in the planarization layer; the plurality of the first lead wires are located in the insulation layer; a first via is disposed between the insulation layer and the planarization layer; and the end of each of the plurality of the first lead wires is connected to one of the plurality of the first touch electrodes through the first via.

4. The touch substrate as claimed in claim 3, wherein the first touch electrodes comprise a plurality of touch sub-electrodes connected in sequence; bridge points are disposed on intersection positions of the first touch electrodes and the second touch electrodes, and the bridge points are located on the insulation layer; second vias are disposed between the insulation layer and the planarization layer; adjacent two of the touch sub-electrodes are respectively connected to the bridge points through the second vias to make the adjacent two touch sub-electrodes form bridge connections.

5. The touch substrate as claimed in claim 4, wherein a projection region of the bridge points on the planarization layer and a projection region of the first lead wires located in the touch region on the planarization layer are spaced apart from each other.

6. The touch substrate as claimed in claim 2, wherein a via, a groove, or a fracture is disposed on the first metal mesh wires, the first metal mesh wire comprises a plurality of mesh units; a width of the first metal mesh wires along the second direction is at least as a width of the two mesh units, and at most as a width of the four mesh units.

7. The touch substrate as claimed in claim 2, wherein the first touch electrodes are receiving touch electrodes or emission touch electrodes; the second touch electrodes are receiving touch electrodes or emission touch electrodes, and the first touch electrodes are different from the second touch electrodes.

8. The touch substrate as claimed in claim 2, wherein the touch substrate comprises a first connection pin and a second connection pin; the first connection pin and the second connection pin are spaced apart from each other on the binding region; the plurality of the first lead wires comprise third lead wires and fourth lead wires; the third lead wires are respectively connected to the first connection pin; the fourth lead wires are respectively connected to the second connection pin.

9. A display panel comprising a touch substrate; the touch substrate comprising a touch region and a binding region; the touch region and the binding region arranged along a first direction;

wherein the touch substrate comprises a plurality of first touch electrodes, a plurality of first lead wires, a plurality of second touch electrodes, a plurality of second lead wires, an insulation layer, and a planarization layer;

wherein the plurality of the first touch electrodes are located on the touch region; the plurality of the first touch electrodes are sequentially arranged along the first direction; one end of each of the plurality of the first lead wires is connected to the plurality of the first touch electrodes one by one, and another end of each of the plurality of the first lead wires is connected to the binding region; wherein at least one of the plurality of the first lead wires is located in the touch region;

wherein the plurality of the second touch electrodes are located on the touch region; the plurality of the second lead wires sequentially are arranged along a second direction, the second direction is perpendicular to the first direction; the second lead wires are located on the binding region; one end of each of the plurality of the second lead wires is connected to the plurality of the second touch electrodes one by one, and another end of each of the plurality of the second lead wires is connected to the binding region; and wherein the insulation layer and the planarization layer are disposed adjacently; the first touch electrodes, the second touch electrodes, and the second lead wires are located in the planarization layer; the plurality of the first lead wires are located in the insulation layer; a first via is disposed between the insulation layer and the planarization layer; and the end of each of the plurality of the first lead wires is connected to one of the plurality of the first touch electrodes through the first via.

10. The display panel as claimed in claim 9, wherein the first touch electrodes comprise a plurality of touch sub-electrodes connected in sequence; bridge points are disposed on intersection positions of the first touch electrodes and the second touch electrodes, and the bridge points are located on the insulation layer; second vias are disposed between the insulation layer and the planarization layer; adjacent two of the touch sub-electrodes are respectively connected to the bridge points through the second vias to make the adjacent two touch sub-electrodes form bridge connections.

11. The display panel as claimed in claim 10, wherein a projection region of the bridge points on the planarization layer and a projection region of the first lead wires located in the touch region on the planarization layer are spaced apart from each other.

12. The display panel as claimed in claim 9, wherein the first lead wires located in the touch region are first metal mesh wires; the first touch electrodes, the second touch electrodes are second metal mesh wires, wherein a projection of the first metal mesh wires on the touch substrate overlaps a projection of the second metal mesh wires on the touch substrate.

13. The display panel as claimed in claim 12, wherein a via, a groove, or a fracture is disposed on the first metal mesh wire, the first metal mesh wire comprises a plurality of mesh units; a width of the first metal mesh wires along the second direction is at least as a width of the two mesh units, and at most as a width of the four mesh units.

14. The display panel as claimed in claim 12, wherein the first touch electrodes are receiving touch electrodes or emission touch electrodes; the second touch electrodes are receiving touch electrodes or emission touch electrodes, and the first touch electrodes are different from the second touch electrodes.

15. The display panel as claimed in claim 9, wherein the touch substrate comprises first connection pin and second connection pin; the first connection pin and the second connection pin are spaced apart from each other on the binding region; the plurality of the first lead wires comprise third lead wires and fourth lead wires; the third lead wires are respectively connected to the first connection pin; the fourth lead wires are respectively connected to the second connection pin.

* * * * *